United States Patent [19]

Decuyper

[11] 4,247,873
[45] Jan. 27, 1981

[54] SELF-ADAPTIVE, ALL-OR-NOTHING CONVERTER OF AN ANALOG IMAGE ANALYSIS SIGNAL

[75] Inventor: Jean-Claude Decuyper, Elancourt, France

[73] Assignee: Compagnie Industrielle des Telecommunications Cit-Alcatel, Paris, France

[21] Appl. No.: 38,142

[22] Filed: May 11, 1979

[30] Foreign Application Priority Data

May 12, 1978 [FR] France .................................. 78 14216

[51] Int. Cl.³ ................................................ H04N 1/40
[52] U.S. Cl. ........................... 358/282; 340/146.3 AG
[58] Field of Search ............... 358/282; 340/146.3 AG

[56] References Cited

U.S. PATENT DOCUMENTS

| | | | |
|---|---|---|---|
| 3,415,950 | 12/1963 | Bartz | 328/147 |
| 3,696,253 | 10/1972 | Deisch | 307/235 |
| 3,723,649 | 3/1973 | Pitegoff | 358/282 |
| 3,912,943 | 10/1975 | Wilson | 307/235 |
| 3,934,136 | 1/1976 | Schoon | 250/214 R |
| 3,976,833 | 8/1976 | Lavery | 358/282 |
| 4,001,500 | 1/1977 | Lavery | 358/282 |

FOREIGN PATENT DOCUMENTS

2208430 9/1972 Fed. Rep. of Germany .
2223701 10/1974 France .
1219334 1/1971 United Kingdom .

OTHER PUBLICATIONS

"IBM Technical Disclosure Bulletin," vol. 18, No. 6, Nov. 1975, New York, Penny, pp. 1962-1965.

*Primary Examiner*—Howard W. Britton
*Attorney, Agent, or Firm*—Sughrue, Rothwell, Mion, Zinn and Macpeak

[57] ABSTRACT

In a facsimile system, for example, a document is scanned along successive scan lines and is analyzed by a photosensitive reader to produce an analog image analysis signal ($V_a$). This signal is then converted into a two-value (i.e. black and white) signal by an all-or-nothing converter. This is done by a comparator (1) comparing the analog signal ($V_a$) with a threshold ($V_d$); and to avoid losing wanted information, in spite of varying background densities, it is necessary for the relative values of the analog signal ($V_a$) and the threshold ($V_d$) to vary so that the threshold remains somewhere between local maximum and minimum modulation levels over a range of absolute values.

In the present invention successive modulation peaks are detected by a peak detector (2) and their values stored e.g. on a capacitor. First means (a resistor 3) decay the stored value slowly so that while pale image representing peaks occur frequently the threshold as applied by circuit (6) at a value slightly below the peak value. Second means (transistor switch 4) are controlled to cause rapid decay of the stored peak value after the binary output signal has remained at black level for a run of more than 10 or so image points. Switch (5) serves to clear memory between successive scan lines.

8 Claims, 4 Drawing Figures

SELF-ADAPTIVE, ALL-OR-NOTHING CONVERTER OF AN ANALOG IMAGE ANALYSIS SIGNAL

The present invention relates to all-or-nothing converters for analog image analysis signals from a document or the like and hereinafter designated generally as image analysis signals. Such converters are used particularly in installations for transmitting facsimile signals.

It is known, that an analog image analysis signal is a signal that is amplitude modulated between two limiting levels, the maximum black level and the maximum white level corresponding respectively to black elements and white elements of the image. Generally speaking, in the analysis signal as detected, for example by a photo-diode, the white level is higher than the black level. Nonetheless, these relative levels may be inverted in the detected analysis signal by an analog process, for example by means of an operational amplifier delivering the separation between the analysis signal and a constant reference voltage.

All-or-nothing conversion, i.e. for transformation of an analog signal into two levels representing black and white respectively, requires the analog signal to be compared with a decision threshold that lies between the modulation limits. In practice, the decision threshold is chosen to have a value near to the maximum white level.

When the image to be analysed has a greyish or coloured background, whether uniform or not, or merely zones of white and grey with items constituting useful information printed thereon, the comparison of the analog analysis signal with a fixed decision threshold in order to convert the analog signal into a two-value signal is not entirely satisfactory. In such a case the analysis signal has highly variable amplitudes and much of the useful information is likely to disappear during all-or-nothing conversion. If has thus been necessary to apply a correction to the position of the threshold relative to the modulation level. It is known to perform such a correction on the basis of the peak value of the analysis signal, in such a way as to take variations in the background level of the document into account, or from one document to another to take into account variations in level of the useful information to be detected.

Preferred embodiments of the present invention provide precise and automatic matching of the decision threshold to the modulation levels of the image signal.

The present invention provides a self-adaptive all-or-nothing converter for converting an analog image analysis signal into a two-valued signal, the converter comprising:

a comparator for comparing the analog image analysis signal with a decision threshold to produce a two-valued output signal taking one value when the analog image analysis signal is above the decision threshold, and the other value when it is below the threshold; and correction means responsive to the modulation level of the analog image analysis signal to adjust the relative levels, as applied to the comparator, of the analog image analysis signal and the decision threshold, said correction means comprising a peak detector for detecting successive modulation peaks significant of the locally palest of the successive elements of the image as represented by the analog analysis signal, a store for storing the value of the most recently detected peak, first processing means for applying a slow decay to the stored peak value, second processing means for applying a rapid decay to the stored peak value, and a control circuit for controlling said second processing means, the control circuit being arranged, in operation, to detect whenever the modulation signal has remained below the threshold for at least ten elementary points of the image represented by the analog image analysis signal, and then to cause the second processing means to apply said rapid decay to the stored peak value to bring said stored peak value rapidly to a value close to the palest image level then present in the image analysis signal.

An embodiment of the invention is described in greater detail by way of example with reference to the accompanying drawings in which.

Figure 1:
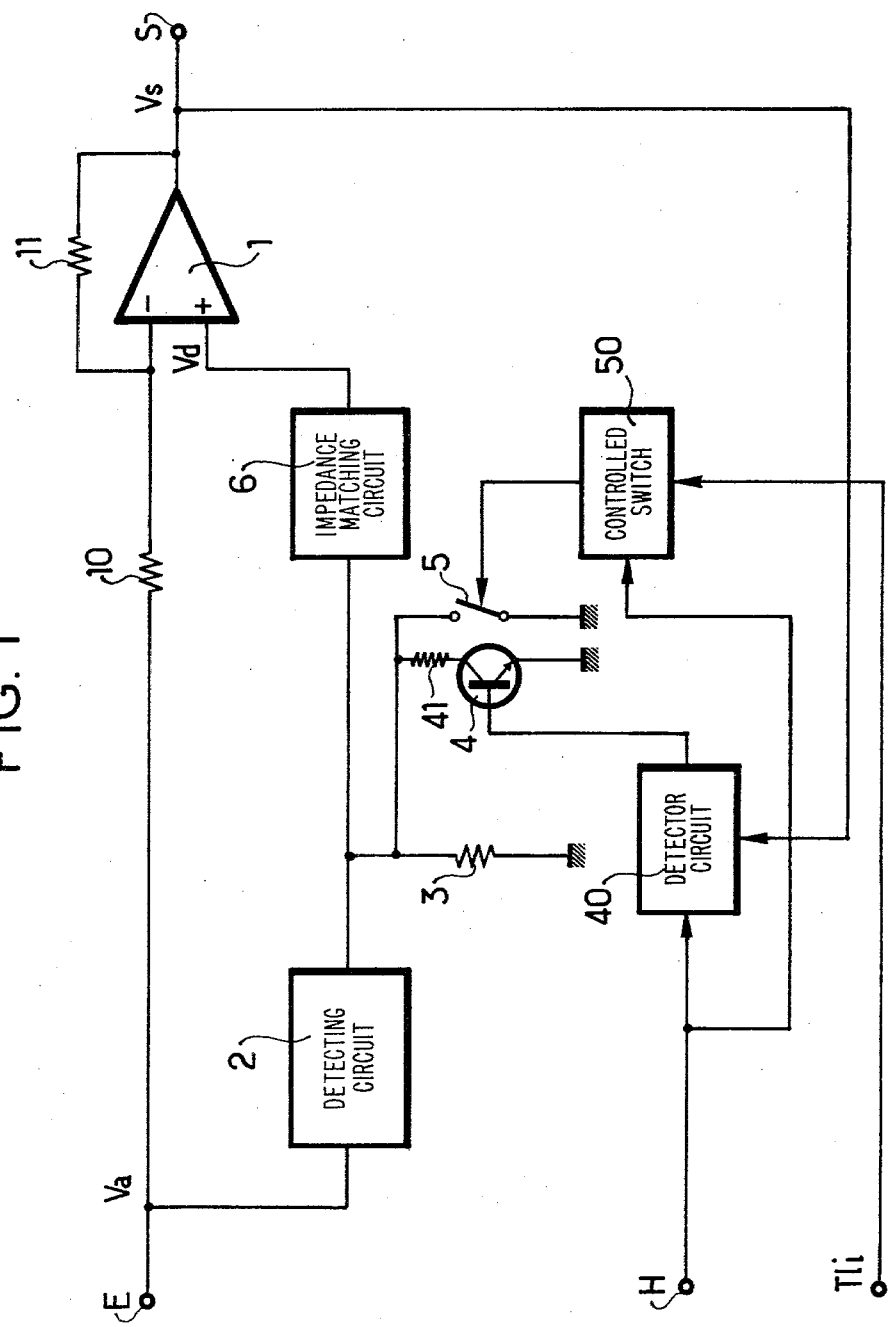
FIG. 1 is a block diagram of a self-adaptive all-or-nothing converter in accordance with the invention.

In FIG. 1 a self-adaptive, all-or-nothing converter is of the type having a variable decision threshold $V_d$. It includes a comparator circuit 1, constituted by an operational amplifier which has one of its inputs, in this case its negative input, connected via a resistor 10 to receive the analog analysis signal $V_a$ which is present at the input E of the converter. In this case the signal $V_a$ is such that the white level is greater than the black level. On its other input, i.e. the + input, the operational amplifier receives the comparison voltage or decision threshold $V_d$. A resistor 11 is connected between the output of the comparator and its − input. The output of the operational amplifier 1 constitutes the output S of the converter on which the output signal $V_s$ constitutes the analysis signal $V_a$, reconstituted in binary form.

The variable decision threshold $V_d$ applied to the comparator 1 is defined on the basis of detecting the peaks in the modulation of the analysis signal $V_a$ and by processing the successively detected peak values. Consequently, the converter includes a circuit 2 for detecting the modulation peaks in the signal $V_a$ applied thereto. The circuit 2 includes a unit, such as a capacitor, for storing the value of the detected peak voltage, and means for processing the detected peak voltage by altering the peak voltage to match the analysis signal. The processing means, not referenced overall in FIG. 1, is divided into a plurality of means each of which applies a specific decay to the detected and stored peak voltage. A first means, constituted by a resistor 3 connected between the output of the circuit 2 and earth, applies a slow expotential decay to the detected and stored peak voltage, this decay having a time constant of about the time it takes to scan 20 to 100 elementary points in the image represented by the analysis signal. A second means, here constituted by a controlled transistor 4, applies a rapid decay to the detected and stored peak voltage via a very low value resistor 41. The transistor is switched on by a circuit 40 which detects the continuing presence of black level in the output signal $V_s$ for a period of time corresponding to the scanning of about 10 of the elementary points of the image on the basis of an image scanning clock signal H which is applied to the circuit 40.

A third processing means is constituted by a controlled switch 5 connected between the output of the circuit 2 and earth. It is used to reset the value of the detected and stored peak voltage to zero. The switch is conntrolled by an "end of image scan line" detection signal which is maintained until the beginning of scanning the following line, and which is delivered by a circuit 50 from the signal H applied thereto and from a control signal known as the "internal local sync" abreviated "ILS" and supplied by the image analyser at the beginning of each line. The stored and detected peak voltage, after being processed by the respective decays which are thus applied thereto, is conveyed via an impedance matching circuit 6 to the + input of the comparator 1 where it defines the value of the decision threshold $V_d$ taking into account the modulation level in the signal $V_a$ then being applied to the comparator.

By virtue of the slow decay of the stored peak voltage via the resistor 3, the detected and stored peak voltage in this all-or-nothing converter retains a practically constant value for as long as elementary points at substantially the same white level follow one another closely, this corresponds in particular to an analysis signal which represents a zone of a document having high information density on a substantially uniform background. In this case, the slow decay of the stored peak voltage is rapidly compensated by the detection of a slightly higher peak in the analysis signal: there is then simply a slight ripple in the value of the stored peak voltage. In contrast, the value of the detected and stored peak voltage will go steadily down if the analysis signal represents analysis of a zone having a darker background: the stored peak voltage will continue automatically to adjust itself towards a smaller value, with a time constant defined for this mode of decay, this adjustment occurs in a ratio which is substantially constant with respect to the voltage of the modulation peaks of the analysis signal $V_a$.

By causing the rapid decay of the stored peak voltage (which is already being adjusted by the slow decay applied thereto) the controlled transistor 4 causes the stored value to reach more quickly a level near to the palest level represented in the analysis signal. This rapid acceleration in the decay of the threshold is applied as soon as the signal of the output of the comparator remains significant of an analysis signal whose amplitude stays below the decision threshold (or value of the stored peak voltage) for a period of time which is about equal to the time needed to scan 10 elementary points. This steep linear decay continues for as long as the output signal remains at the same binary level, thereby returning rapidly to the modulation level.

The controlled switch 5 is switched on during each time interval between two scan lines of the image, thereby resetting the value of the stored peak voltage to zero at the beginning of each analysis line, for the analysis signal representing the information contained in each analysis line.

In a variant, not shown, the self-adaptive all-or-nothing converter may be of the fixed decision threshold type. In a converter of this type, a comparator, such as shown in FIG. 1, is constituted by an operatinal amplifier which receives the fixed decision threshold on its + input and which receives the analysis signal $V_a$ via a variable attenuator circuit including a variable resistance network controlled by the stored peak voltage as processed by the decay means used in the variable decision threshold converter. In this case, the converter operates by performing an approximate regulation of variations in the modulation level by applying a variable gain to the analog analysis signal $V_a$.

Figure 2:
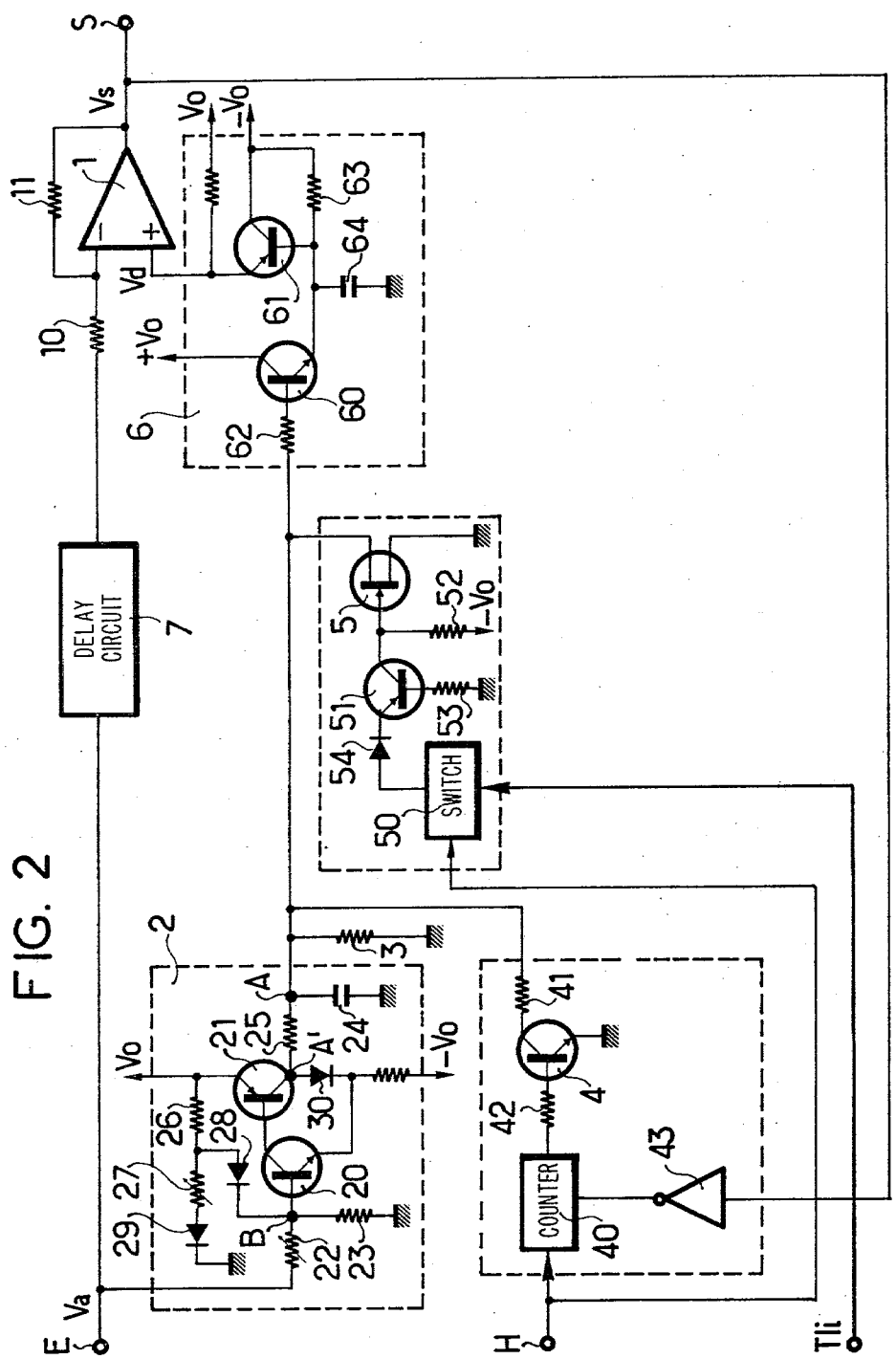
FIG. 2 is a more detailed circuit diagram showing one embodiment of the converter of FIG. 1.

FIG. 2 is an electrical circuit diagram of a self-adaptive converter as shown in FIG. 1. The circuits shown in FIG. 1 have the same reference numerals.

In FIG. 2, the circuit 2 for detecting the modulation peaks in the analysis signal $V_a$ is essentially constituted by two transistors 20 and 21. The transistor 20 is an NPN transistor and receives the signal $V_a$ on its base via an adjustable resistance 22. A resistor 23 also connects the base of this transistor to earth. The transistor 21 is a PNP type transistor, its base is connected to the collector of the transistor 20 while its emitter is connected to bias supply $+V_o$. Its collector is connected to the emitter of the transistor 20 and to a supply $-V_o$ via an unreferenced bias resistor. The peak voltage of the signal $V_a$ is stored on a capacitor 24 which is connected via a load resistor 25 to the collector of the transistor 21. An auxiliary voltage taken from the supply $+V_o$ is also applied to the base of the transistor 20: two resistors 26 and 27 are connected between the supply $+V_o$ and earth, their common point is connected to the base of the transistor 20 via a diode 28. Diodes 29 and 30 provide temperature stability for the circuit 2: the diode 29 is connected between the resistor 27 and earth to compensate temperature effects on the diode 28, while the diode 30 is connected between the collector of the transistor 21 and the point common to its bias resistor and the emitter of the transistor 20 to provide temperature compensation of the base-emitter junction of the transistor 20.

The point common to the capacitor 24 and its load resistor 25 is designated A, the point common to the collector of the transistor 21 and the resistor 25 is designated A', and the point common to the two resistors 22 and 23 as well as to the diodes 28 and the base of the transistor 20 is designated B. In this circuit 2, the voltage at B increases with the signal $V_a$ and it is equal to $V_a$ attenuated by the ratio defined by the resistors 22 and 23. Both transistors 20 and 21 are conductive when the voltage at B has a value greater than the voltage at A'. In this case the voltage at A' becomes substantially equal to the voltage at B and the capacitor 24 charges rapidly (the time constant is defined by capacitor 24 and its load resistor 25 which has a very low value).

The voltage at A thus rapidly rises to the voltage at B to within the small voltage drop across the resistor 25.

When the voltage at B becomes less than that at A' both transistors 20 and 21 are turned off.

Point A is connected via the impedance matching circuit 6 to the + terminal of the operational amplifier 1 to apply the decision threshold voltage $V_d$ thereto. The circuit 6 includes two transistors 60 and 61. The transistor 60 is an NPN type transistor with its base connected to the point A via a resistor 62, its collector connected to a bias supply $+V_o$, and its emitter connected to a supply $-V_o$ via a resistor 63. The transistor 61 is a PNP type transistor and has its base connected to the emitter of the transistor 60, its collector is connected to the supply $-V_o$ while its emitter which is biassed from the supply $+V_o$ is connected to the $-$ input of the operational amplifier 1. In addition, a high frequency filtering capacitor 64 is connected between earth and the point common to the emitter of the transistor 60 and the base of the transistor 61. The circuit 6 has a high input impedance and a low output impedance. Since the gain of the circuit 6 is equal to 1, the voltage $V_d$ constituting the decision threshold is equal to the voltage at the point A.

The means for decaying the value of the peak stored on the capacitor 24 are associated with the peak detection circuit 2. The resistor 3 connected in parallel with the capacitor causes a slow expotential decay of the stored peak value for as long as both of the transistors 20 and 21 are switched off (the discharge time constant defined by the capacitor 24 and the resistor 3 is much greater than the charging time contant defined by the capacitor 24 and the resistor 25).

In addition to the expotential decay, the transistor 4 enables the decay of the stored value to be accelerated. The transistor 4 is an NPN type transistor and its collector connected to the point A via a resistor 41, with its emitter connected to earth. Its base is controlled by a circuit 40 via a resistor 42. The circuit 40 is a divide-by-twelve counter which receives clock pulses H defining the scan rate of successive image points represented in the analysis signal, this counter is controlled by the output signal of the inverter 43 whose input is connected to the output of the amplifier 1. The inverter 43 keeps the counter at zero for as long as the output of the amplifier 1 is at a level indicative of an analysis signal $V_a$ which is greater than the decision threshold $V_d$. It enables the counter 40 to count the clock pulses when the output of the operational amplifier 1 indicates that the signal $V_a$ is below the threshold $V_d$. The "twelve" state of the counter turns on the transistor 4, thereby causing a rapid discharge of the capacitor 24 until the voltage at A or the decision threshold $V_d$ drops below the $V_a$. The discharge of the capacitor 24 through the transistor 4 makes it possible to recover the modulation level of the analysis signal $V_a$ rapidly.

The charge on the capacitor 24 is reset to zero by means of the controlled switch 5 (FIG. 1). The controlled switch is constituted, in this case, by a field effect transistor whose drain and source are connected between the point A and earth. The gate of the FET is connected to the collector of a PNP transistor 51. The collector of the PNP transistor is also connected to the $-V_o$ supply via a resistor 52. The base of the transistor 51 is connected to earth via a resistor 53 and its emitter is connected via a diode 54 to the circuit 50 which provides biassing suitable for making the transistor 51 conductive at the end of each analysis line in the image and throughout the period separating the consecutive image analysis lines. The circuit 50 includes a counter circuit controlled at the beginning of each line by an internal local sync signal (abreviated "ILS"), provided by the image analyser. The circuit 50 counts the number of pulses H corresponding to the set of image points in each line and the number of pulses H corresponding to the period between successive scan lines in order to cause the transistor 51, and hence the FET 5, to be conductive during the flyback period. The FET 5 causes the capacitor 24 to discharge totally and keeps it discharged throughout the period of return to the beginning of an image analysis line. By way of a non illustrated variant, data indicative of a flyback period could be supplied directly to the circuit 60 on its "ILS" input terminal in the form of an internal local sync signal generated by the image analyser throughout the entire flyback period, which would then make it possible to do without the counter of the circuit 50.

The circuit shown in FIG. 2 further includes a delay circuit 7 which receives the signal $V_a$ and applies it, to the operational amplifier 1, after a delay of a few microseconds corresponding to a few image points in the signal $V_a$. This delay applied to the signal $V_a$ before its comparison with the decision threshold $V_d$ causes it to be slightly shifted with respect to the detected peak value as adjusted by the decay processes applied thereto. The circuit is thereby made more sensitive to transitions from a grey background image zone to a lighter background image zone. Such a transition will appear in the signal $V_s$ which will thereby be brought to black level for several image points.

Figure 3:
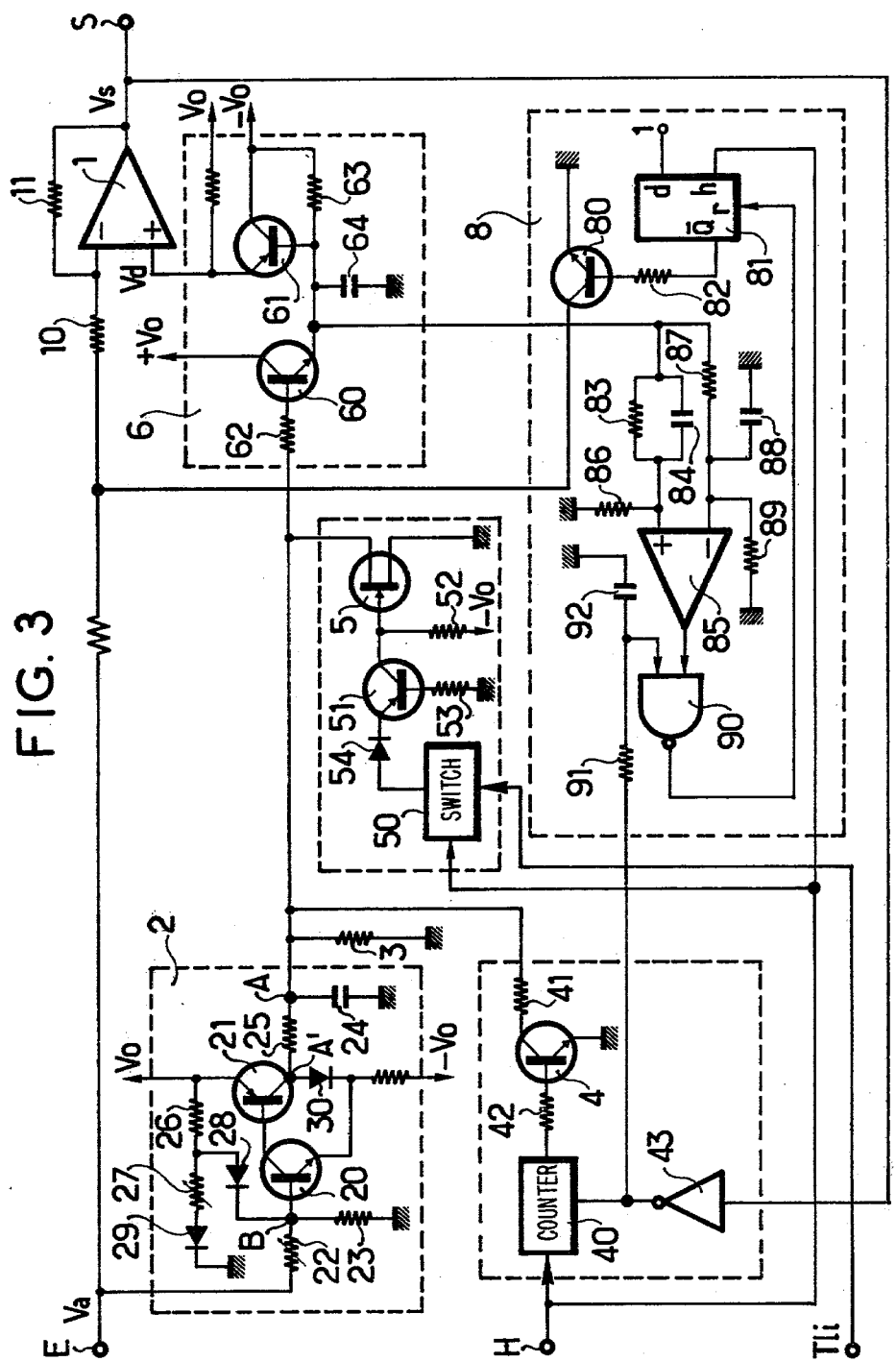
FIG. 3 is a detailed circuit diagram of a converter in accordance with FIG. 1, showing a variant in the realisation of some of the circuits appearing in FIG. 2.

FIG. 3 shows a variant embodiment in which the delay circuit 7 is replaced by a processing circuit 8, while the remaining elements are left identical.

The circuit 8 includes an NPN type transistor 80 whose emitter is connected to earth and whose collector is connected to the path which transmits the signal $V_a$ to the operational amplifier 1. The transistor 80 is controlled by a D type bistable 81: the inverted output $\overline{Q}$ of the bistable 81 is connected to the base of the transistor 80 via a resistor 82. The bistable 81 has a clock input h on which it receives the clock pulses H which define the scan rate along an image line. The data input d of the bistable is connected to an permanent level 1. The bistable also receives a control signal applied to its reset to zero input r. This control signal is derived from a detection of a significant rise in the decision threshold $V_d$, while the signal $V_s$ at the output of the converter is indicative of a white level. For this purpose, the emitter of the transistor 60 in the impedance matching circuit 6 is connected firstly via a resistor 83 and a decoupling capacitor 84 to the + input of an operational amplifier 85, which input is also connected to earth via a resistor 86, and secondly via a resistor 86, capacitor 88 integrator circuit to the − input of the operational amplifier which is also connected to earth via a resistor 89. The operational amplifier 85 delivers a short pulse each time that there is a large increase in the threshold $V_d$. A NAND gate 90 receives the output signal of this operational amplifier on one input and the signal delivered by the inverter 43 on another input via a resistor 91 which is associated with a capacitor 92 connected to earth. The output of the NAND gate 90 resets the bistable 81 to zero when a large increase in the threshold is detected in conjunction with the signal $V_s$ being indicative of while level. The bistable 81 then applies a short control pulse to the transistor 80 which reduces the level of the signal $V_a$ momentarily so that it will appear to the comparator 1 to be below the signal $V_d$ and will therefore be treated as though it represented a few black level image points.

Figure 4:
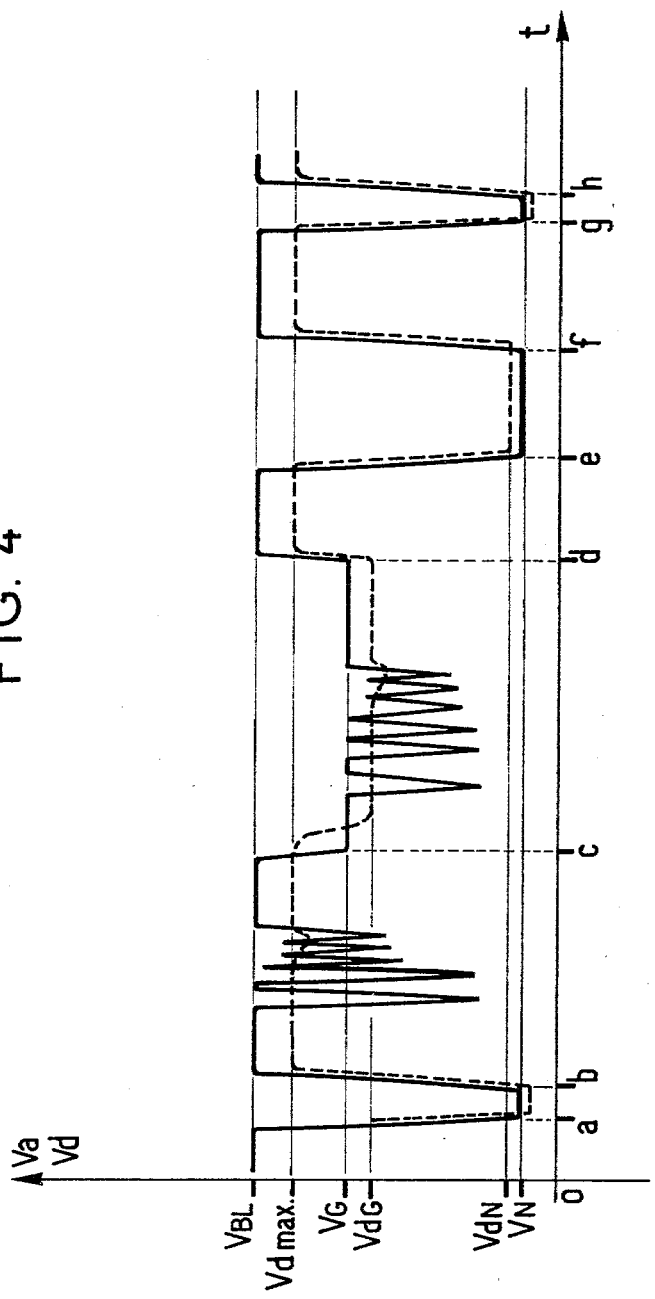
FIG. 4 is a waveform diagram for describing the operation of a converter in accordance with the invention.

The operation of the circuit shown in FIG. 2 is explained in greater detail with reference to the waveform diagram shown in FIG. 4. FIG. 4 shows the input signals applied to the operational amplifier 1, the solid line representing a signal $V_a$ and a dotted line representing the decision threshold $V_d$ varying as a function of $V_a$. In this diagram, the signal $V_a$ is considered without the delay normally applied thereto by the circuit 7 prior to its comparison with $V_d$. The maximum white level of the image is designated $V_{BL}$, the maximum black level is designated $V_N$, where $V_{BL}$ is greater than $V_N$ in this case. The interval a-b represents a flyback period during which the FET 5 is conductive thereby discharging the capacitor 24 and maintaining its discharge state: the voltage at A or the value of the decision threshold $V_d$ being close to earth potential and less than $V_N$.

During an interval referenced b-c, the signal $V_a$ represents the presence of data on a maximum white background. At the beginning of this interval the FET 5 is turned off. The voltage at B rises with $V_a$, both the transistors 20 and 21 being conductive and the voltage at A' is substantially equal to that at B. The capacitor 24 charges rapidly, and so long as the signal $V_a$ is at the level $V_{BL}$, the voltage at A, i.e. $V_d$ rises rapidly to a value designated by $V_{dmax}$ which is equal to $V_{BL}$ reduced by the ratio defined by the value of the resistors 22 and 23 and by the small voltage drop across the resistor 25. When the value of the signal $V_a$ drops rapidly, the voltage at B becomes less than that at A' and the transistors 20 and 21 are turned off. The capacitor 24 then discharges slowly through the resistor 3. With the value of $V_a$ rising almost at once to $V_{BL}$, or to a value very close thereto, both transistors 20 and 21 are again turned on. During this interval the voltage at A stays substantially constant: the slow discharge of the capacitor 24 is compensated by the detection of successive peaks $V_{BL}$. The decision threshold $V_d$ is thus maintained during this interval at practically the same level as $V_{dmax}$, with a few ripples slightly below $V_{dmax}$.

During an interval referenced c-d, the analysis signal $V_a$ is considered as being representative of image data on a grey background of the document. The palest level on the document which was previously $V_{BL}$ now becomes $V_G$, $V_G$ being less than $V_{BL}$. Both transistors 20 and 21 are turned off. The level $V_G$ is maintained long enough for the capacitor 24 to discharge slowly initially via the resistor 3 and then rapidly via the transistor 4 which is switched on by the circuit 40 at the moment that the voltage at A, i.e. the voltage $V_d$, reaches a value $V_{dG}$ which is slightly less than the $V_G$. The transistors 20 and 21 then become conductive and the circuit operates during the interval b-c with short slow discharges of the capacitor 24 during excursions of $V_a$ below $V_G$ followed by a return of the voltage at A to the level $V_{dG}$ at each new peak detection at a value $V_G$.

During an interval reference d-e, the signal $V_a$ again represents analysis of a document having its background at the level $V_{BL}$. The decision threshold rises to the value $V_{dmax}$ by means of the transistors 20 and 21 being conductive.

During an interval referenced e-f, the analysis signal $V_a$ has a value very close to $V_N$, although slightly above $V_N$, and represents the analysis of a black line for example on the corresponding portion of the image analysis line. The voltage at B falls with $V_a$, both transistors 20 and 21 are turned off and the charge of the capacitor falls, initially slowly and subsequently rapidly. The decision threshold $V_d$ thus falls to a value $V_{dN}$, slightly above $V_N$, determined by the injection of an auxiliary voltage from the supply $V_o$ via diode 28 which then becomes conductive and turns on the transistors 20 and 21. The voltage at 8 then remains constant and $V_d$ retains the value $V_{dN}$, thereby enabling the output signal $V_s$ to remain at a level indicative of black corresponding to the black line represented by the analysis signal. Maintaining the signal $V_s$ at the black level may give rise, by virtue of the transistor 4 being controlled by the circuit 40 and the inverter 43, to brief excursions of these signals $V_d$ below the level $V_{dN}$, however, the level $V_{dN}$ is immediately re-established by the injection of the auxiliary voltage via the circuit 2.

In an interval referenced f-g, the signal $V_a$ is considered to have returned to the level $V_{BL}$, as the signal $V_d$ rises to the level $V_{dmax}$ as for the interval d-e.

During an interval referenced g-h, the signal $V_a$ represents the flyback of the analysis line. During this interval the threshold $V_d$ has a value below $V_N$ as for the interval a-b by virtue of the complete discharge of the capacitor 24 through the field effect transistor 5.

I claim:

1. A self-adaptive all-or-nothing converter for converting an analog image analysis signal into a two-valued signal, the converter comprising:

a comparator for comparing the analog image analysis signal with a decision threshold to produce a two-valued output signal taking one value when the analog image analysis signal is above the decision threshold, and the other value when it is below the threshold; and correction means responsive to the modulation level of the analog image analysis signal to adjust the relative levels, as applied to the comparator, of the analog image analysis signal and the decision threshold, said correction means comprising a peak detector for detecting successive modulation peaks significant of the locally palest of the successive elements of the image as represented by the analog analysis signal, a store for storing the value of the most recently detected peak, first processing means for applying a slow decay to the stored peak value, second processing means for applying a rapid decay to the stored peak value, and a control circuit for controlling said second processing means, the control circuit being arranged, in operation to detect whenever the modulation signal has remained below the threshold for at least ten elementary points of the image represented by the analog image analysis signal, and then to cause the second processing means to apply said rapid decay to the stored peak value to bring said stored peak value rapidly to a value close the palest image level then present in the image analysis signal.

2. A self-adaptive all-or-nothing converter according to claim 1, in which each detected peak value is stored on a capacitor, wherein said first processing means are constituted by a resistance connected in parallel with the said capacitor, and defining therewith a time constant corresponding to the duration of several tens of elementary image points as represented by the said analysis signal; said second processing means are constituted by a transistor; and said control circuit including a counter which receives pulses on a clock input at the rate of elementary image points as represented by the analysis signal and which is reset to zero by a signal delivered from the said comparator.

3. A self-adaptive all-or-nothing converter according to claim 1 or 2, wherein the said peak detector comprises a pair of complementary NPN and PNP transistors, and NPN transistor receiving the analysis signal on its base via a resistor network and having its collector connected to the base of the PNP transistor and having its emitter connected to the collector of the PNP transistor.

4. A self-adaptive all-or-nothing converter according to claim 3, wherein said peak detector further comprises a circuit for injecting an auxiliary voltage, having a voltage slightly above the minimum level of the analysis signal representative of a maximum black level in the image, and connected to the base of the NPN transistor via a diode which becomes conductive when the said analysis signal drops below the said auxiliary voltage, the minimum value at which the said peaks may then be detected being the value of the auxiliary voltage.

5. A self-adaptive all-or-nothing converter according to claim 1 or 4, including a delay circuit transmitting the said analysis signal to the said comparator and applying a delay thereto corresponding to a few image points as represented in the said analysis signal.

6. A self-adaptive all-or-nothing converter according to claim 1 or 4, including a circuit for detecting large rises in the said decision threshold and for applying an impulse causing a temporary reduction in the level of the analysis signal.

7. A self-adaptive all-or-nothing converter according to claim 1 including means for re-setting to zero the values of the detected peaks, said means being controlled by a circuit for detecting the end of one image analysis line and the beginning of the next image analysis line, and constituted by a counter circuit for counting the number of image points in each image analysis line as represented by the analysis signal and for counting the number of image points corresponding to the flyback period of the analysis line.

8. A self-adaptive all-or-nothing converter according to claim 1 or 6, further including means for resetting the detected peak values to zero under the control of a signal provided by an image analyser during flyback.

* * * * *